United States Patent
Watanabe et al.

[11] Patent Number: 6,048,792
[45] Date of Patent: Apr. 11, 2000

[54] METHOD FOR MANUFACTURING AN INTERCONNECTION STRUCTURE IN A SEMICONDUCTOR DEVICE

[75] Inventors: Kenji Watanabe; Masashi Ichikawa, both of Tokyo, Japan

[73] Assignee: NEC Corporation, Tokyo, Japan

[21] Appl. No.: 08/881,100

[22] Filed: Jun. 24, 1997

[30] Foreign Application Priority Data

Jun. 27, 1996 [JP] Japan .................................. 8-167903

[51] Int. Cl.$^7$ .................................................. H01L 21/44
[52] U.S. Cl. ...................... 438/656; 438/625; 438/637; 438/643; 438/666; 257/774
[58] Field of Search .................................. 438/656, 627, 438/628, 637, 638, 622, 625, 629, 630, 666, 643, 644; 257/774

[56] References Cited

U.S. PATENT DOCUMENTS

| 5,055,423 | 10/1991 | Smith et al. . |
| 5,202,579 | 4/1993 | Fujii et al. . |
| 5,266,526 | 11/1993 | Aoyama et al. . |
| 5,284,799 | 2/1994 | Sato . |
| 5,332,691 | 7/1994 | Kinoshita et al. . |
| 5,700,726 | 12/1997 | Huang et al. . |
| 5,851,914 | 12/1998 | Han et al. . |
| 5,874,360 | 2/1999 | Wyborn et al. . |

FOREIGN PATENT DOCUMENTS

| 0 587 401 A2 | 3/1994 | European Pat. Off. . |
| 0 689 231 A2 | 12/1995 | European Pat. Off. . |
| 1-217908 | 8/1989 | Japan . |
| 1-239956 | 9/1989 | Japan . |
| 4-298031 | 10/1992 | Japan . |
| 5-3170 | 1/1993 | Japan . |
| 5-90199 | 4/1993 | Japan . |
| 5-315284 | 11/1993 | Japan . |
| 6-275727 | 9/1994 | Japan . |
| 7-249624 | 9/1995 | Japan . |
| 2268329 | 1/1994 | United Kingdom . |

OTHER PUBLICATIONS

Japanese Office Action dated Mar. 3, 1998 with English language translation of Japanese Examiner's comments.
European Search Report, Dec. 8, 1997.
L. Chang, et al. "Chemical Vapor Deposition Tungsten via Plug Process Development With Polyimide Interlevel Dielectric in a Multilevel Metal System", Journal of Vacuum Science & Technology B 10, (1992) Sept./Oct., No. 5.

*Primary Examiner*—Olik Chaudhuri
*Assistant Examiner*—Ginette Peralta
*Attorney, Agent, or Firm*—Whitham, Curtis & Whitham

[57] ABSTRACT

A method for forming an interconnection structure in a semiconductor device includes the steps of forming a thin, first tungsten film in a via-hole by a first LPCVD process using $SiH_4$ gas and $WF_6$ gas simultaneously and forming a thick, second tungsten film to fill the via-hole by a second LPCVD process using $H_2$ gas and $WF_6$ gas, and patterning the second tungsten film to leave a tungsten plug in the via-hole. A reliable contact between the tungsten plug and an underlying interconnect or diffused region can be obtained by not introducing SiH4 gas alone to avoid an excess amount of $SiH_4$.

8 Claims, 7 Drawing Sheets

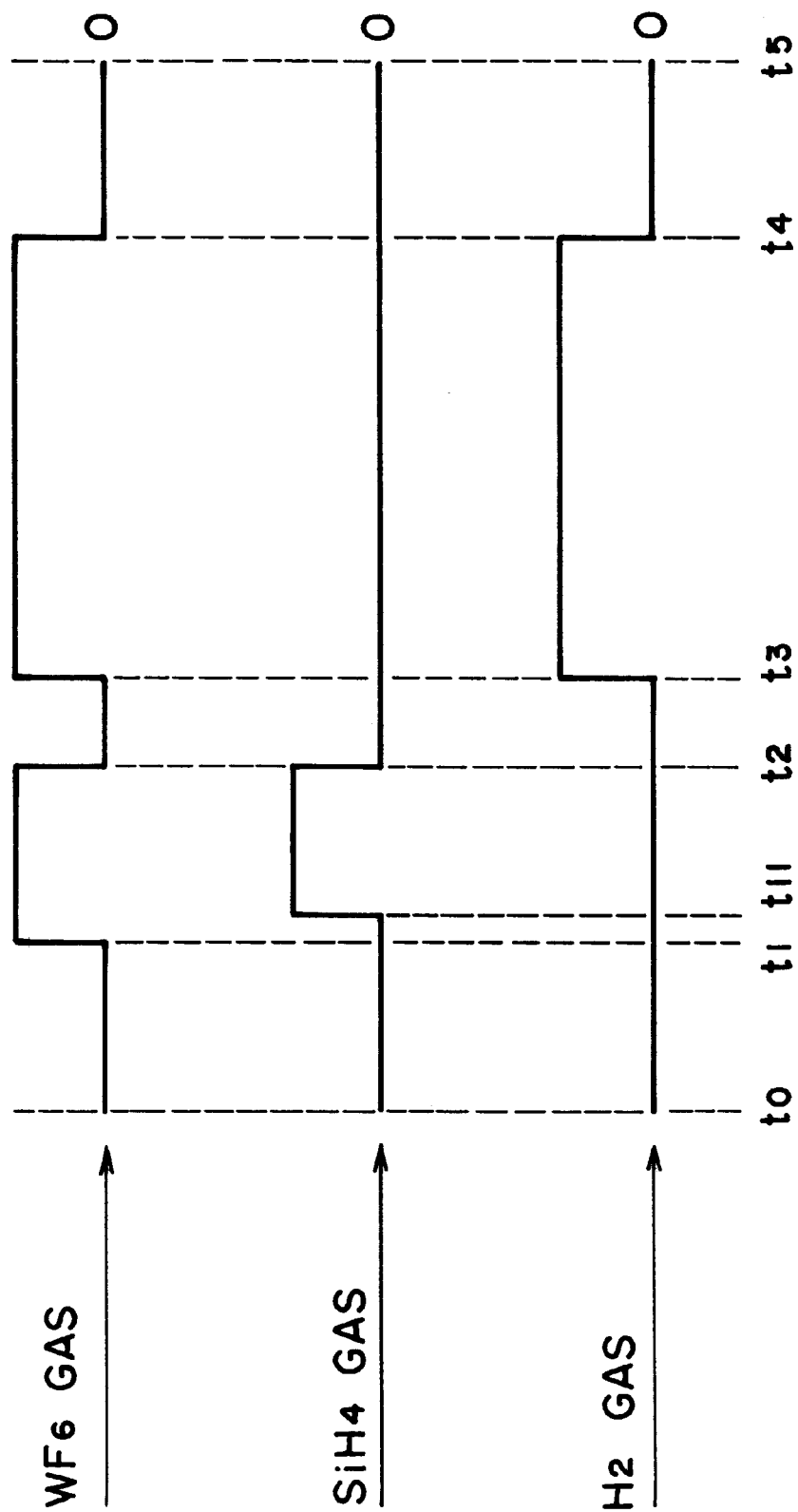

METHOD FOR MANUFACTURING AN INTERCONNECTION STRUCTURE IN A SEMICONDUCTOR DEVICE

BACKGROUND OF THE INVENTION (a) Field of the Invention

The present invention relates to a method for manufacturing an interconnection structure in a semiconductor device and, more particularly, to a method for forming a tungsten film or plug in a via-hole for an interconnection structure.

(b) Description of the Related Art

Recently, the aspect ratio of via-holes formed on an interconnection layer or on a diffused layer is increased in a ULSI device having a higher integration density. Thus, satisfactory connection between via-hole and the underlying diffused layer or lower interconnection layer is difficult to obtain by using a conventional aluminum (Al) single-layer interconnects. In view of this, chemical vapor deposited (CVD) tungsten (W) films are increasingly used to bury the via-holes having a high aspect ratio.

Examples of the methods for forming a CVD tungsten film on an interlayer dielectric film include a selective growth technique, such as described in JP-A-4(1992)-298031 and 5(1993)-90199, wherein tungsten film is selectively formed only in via-holes formed in an interlayer dielectric film and a blanket technique wherein a tungsten film is first formed on the entire surface including within via-holes and subsequent etch-back of the tungsten film to remove the tungsten film from the interlayer dielectric film.

The selective growth technique has advantages of low costs and reduced steps as compared to the blanket technique. However, the selective growth technique has a disadvantage of an unstable process in a mass production, which involves defective selective growth and degradation in electric characteristics of the resultant tungsten film, as generally involved in a process using the difference in the surface characteristics.

In the blanket technique, a barrier metal which is also used in the conventional Al interconnects can be used as an adhesive layer, which allows the tungsten layer effectively deposited on the underlying layer of any material and within different via-holes of any depth. Accordingly, the blanket technique is increasingly used as a key technology for the high aspect ratio via-holes.

FIGS. 1A and 1B show a process for the blanket technique, and FIG. 2 is a timing chart for introduction of gases during the process. In FIG. 1A, a gate electrode 14 is formed on a silicon substrate 11 with an intervention of a gate insulator film not shown, followed by ion-implantation into the substrate 11 to form diffused regions 13 for source and drain. Then, an interlayer dielectric film 15A made of boron-doped phospho-silicate glass (BPSG), followed by patterning to form a via-hole 16 on the diffused regions 13. Subsequently, a Ti—Ni barrier metal layer 19 and a silicon layer 23 are consecutively deposited on the entire surface, wherein the silicon (Si) film 23 is deposited by thermal decomposition of $SiH_4$, as shown in FIG. 1A, during time interval between ts1 and ts2 as shown in FIG. 2, the silicon film 23 serving for prevention of leakage current in the semiconductor device.

Next, $SiH_4$ and $WF_6$ gases are introduced into the chamber, during time interval between t1 and t2 in FIG. 2, to form a first CVD tungsten film 20 having an excellent adhesiveness, followed by deposition of a second CVD tungsten film 21 having a larger thickness to fill the via-holes 16, using $H_2$ and $WF_6$ gases during time interval between t3 and t4. The $H_2$ gas provides a higher deposition rate for the second tungsten film 21 compared to $SiH_4$ gas. Thereafter, the first and second tungsten films 20 and 21 are etched-back to expose the Ti—Ni barrier films 19, followed by deposition of Al film 22 on the entire surface. The Al film 22 and Ti—Ni film 19 are then patterned to achieve Al interconnects 22 which are connected to diffused region 13 via tungsten films.

FIG. 3 shows another conventional blanket technique, wherein the tungsten film is deposited on an underlying interconnect layer to form tungsten plug within the via-holes. In this process, via-holes are formed on a first Al interconnect layer 25 overlying a silicon substrate 11. Then, an interlayer dielectric film 15A made of BPSG is formed on the entire surface, followed by patterning thereof to form via-holes exposing therethrough the underlying interconnects 25.

Next, Ti—Ni film 19, Si film 23, first tungsten film 20, second tungsten film 21 and overcoat layer are consecutively formed, as the first conventional case.

The conventional blanket processes for the tungsten film have disadvantages that particles are formed in the tungsten films, which causes a short-circuit failure in the semiconductor device, that a large contact resistance is formed between the tungsten film and the underlying interconnects to degrade the reliability of the semiconductor device, and that the throughput is relatively low.

SUMMARY OF THE INVENTION

In view of the above, it is an object of the present invention to provide a method for manufacturing a semiconductor device capable of forming a reliable tungsten film with a higher throughput.

The present invention provides, in a first aspect thereof, a method for forming an interconnection structure in a semiconductor device including the steps of: forming a diffused region in a semiconductor substrate; forming on the semiconductor substrate a first dielectric film having a first via-hole exposing the diffused region; forming a barrier layer on an inner surface of the first via-hole including the exposed diffused region; forming on the first dielectric film a second dielectric film having a second via-hole at the location of the first via-hole for exposing the barrier layer; depositing a conductor layer on an exposed surfaces of the second dielectric film and the exposed barrier layer in the second via-hole; forming a first tungsten film on the conductor layer by a first CVD process using $SiH_4$ and $WF_6$ gases while maintaining a flow rate ratio between $SiH_4$ gas and $WF_6$ gases within a specified range, thickness of both the conductor layer and first tungsten film being smaller than the thickness of the second dielectric film; forming a second tungsten film on the first tungsten film by a second CVD process using $H_2$ and $WF_6$ gases, the second tungsten film filling the second via-hole; patterning the second tungsten film to leave a tungsten plug in the second via-hole; and forming an interconnect layer overlying the second dielectric film and in contact with the tungsten plug.

The present invention also provides, in a second aspect thereof, another method for forming an interconnection structure in a semiconductor device including the steps of: forming a first interconnect layer overlying a semiconductor substrate; forming a dielectric film having a via-hole exposing a portion of the first interconnect layer; forming a first tungsten film on the dielectric layer by a first CVD process using SiH$_4$ and WF$_6$ gases while maintaining a flow rate ratio between SiH$_4$ gas and WF$_6$ gas within a specified range, thickness of the first tungsten film being smaller than the thickness of the dielectric film; forming a second tungsten film on the first tungsten film by a second CVD process using H$_2$ and WF$_6$ gases, the second tungsten film filling the via-hole; patterning the second tungsten film to leave a tungsten plug in the via-hole; and forming a second interconnect layer overlying the dielectric film and in contact with the tungsten plug.

In accordance with the present invention, the first tungsten film is formed by using SiH$_4$ gas together with WF$_6$ gas, and accordingly, the SiH$_4$ gas is not used alone before using the WF$_6$ gas. By the configuration, the excess amount of SiH$_4$ gas is prevented to thereby reduce the number of particles occurring in the first tungsten film. In the conventional technique, it was found by the inventor that the SiH$_4$ gas introduced during formation of the Si film before introduction of WF$_6$ gas caused an excess amount of the SiH$_4$ gas compared to the WF$_6$ gas during formation of the first tungsten film, the excess amount of the SiH$_4$ gas generating particles made of tungsten or silicon crystals scattered on the semiconductor substrate.

Moreover, it was found that the formation of the underlying conductor layer by using the SiH$_4$ gas in the conventional process increased the time period in which the underlying conductor layer was subjected to a thermal treatment, which caused a thermal expansion of the underlying conductor layer to allow the underlying conductor layer to protrude in the via-hole in the form of minute pins. The protrusions or minute pins of the conductor layer increased the contact resistance between the underlying conductor layer and the first tungsten film. In the present invention, the protrusions are significantly reduced by the reduction of the time period for thermal treatment, which is obtained by not using the SiH$_4$ gas during the formation of the underlying conductor layer. The reduction of the time period for the thermal treatment also enhances throughput of the semiconductor device.

The above and other objects, features and advantages of the present invention will be more apparent from the following description taken conjunction with the attached drawings.

BRIEF DESCRIPTION OF THE DRAWINGS

FIG. 6 is a timing chart of introduction of gases in a method according to a second embodiment of the present invention.

PREFERRED EMBODIMENTS OF THE INVENTION

Now the present invention is more specifically described byway of preferred embodiments thereof with reference to the accompanying drawings.

Figure 4A:
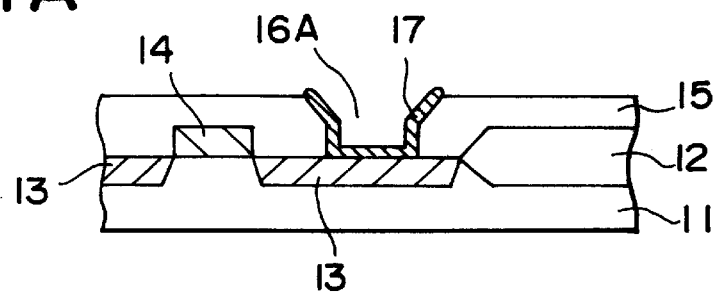
FIGS. 4A to 4D are sectional views of a semiconductor device, showing consecutive steps of a process for manufacturing the semiconductor device according to a first embodiment of the present invention.

Referring to FIG. 4A, a transistor element having diffused regions 13 for source and drain and a gate electrode 14 is first formed on a silicon substrate 11 having thereon a field oxide film 12 for separation of the transistor elements. A first interlayer dielectric film 15 made of BPSG is then formed on the entire surface to a thickness of about 200 nm, followed by patterning thereof to form a via-hole 16A exposing a portion of the diffused regions 13. Subsequently, a sputtering and metallizing process is effected to form a 50-nm-thick tungsten silicide film 17, followed by patterning the same to leave the tungsten silicide film within the via-hole 16a, thereby obtaining the structure shown in FIG. 4A.

Figure 4B:
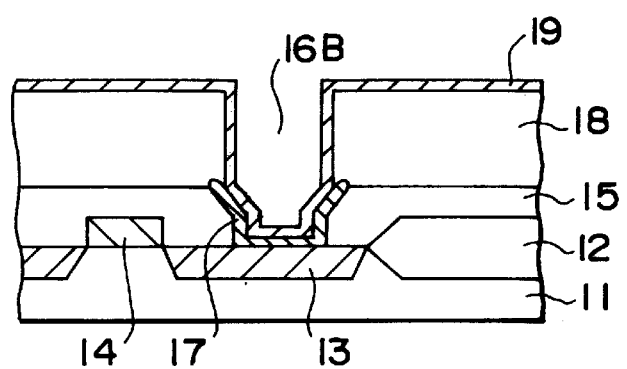

Subsequently, a second interlayer dielectric film 18 made of, for example, boron-silicate glass (BSG) is formed on the entire surface to a thickness of 500 nm to 1 $\mu$m, followed by patterning thereof to form a second via-hole 16B aligned with the first via-hole 16A. Thereafter, a metallizing technique is effected to the device at a temperature between 300° C. and 400° C., an ambient pressure between 3 mTorr and 5 mTorr, and an acceleration power between 2 kW and 3 kW to form a Ti—Ni film 19 on the entire surface to a thickness between 100 nm and 150 nm, as shown in FIG. 4B.

Figure 4C:
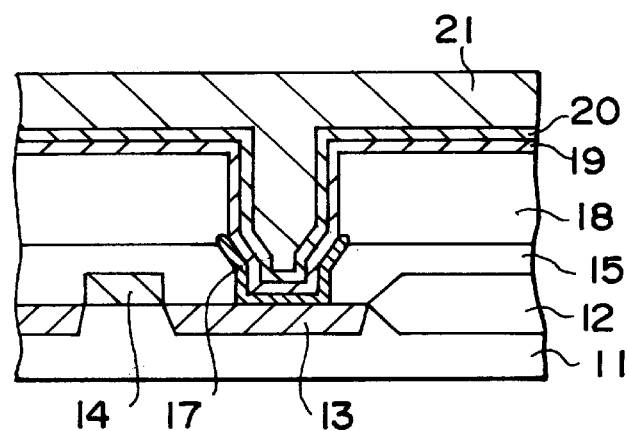
Figure 5:
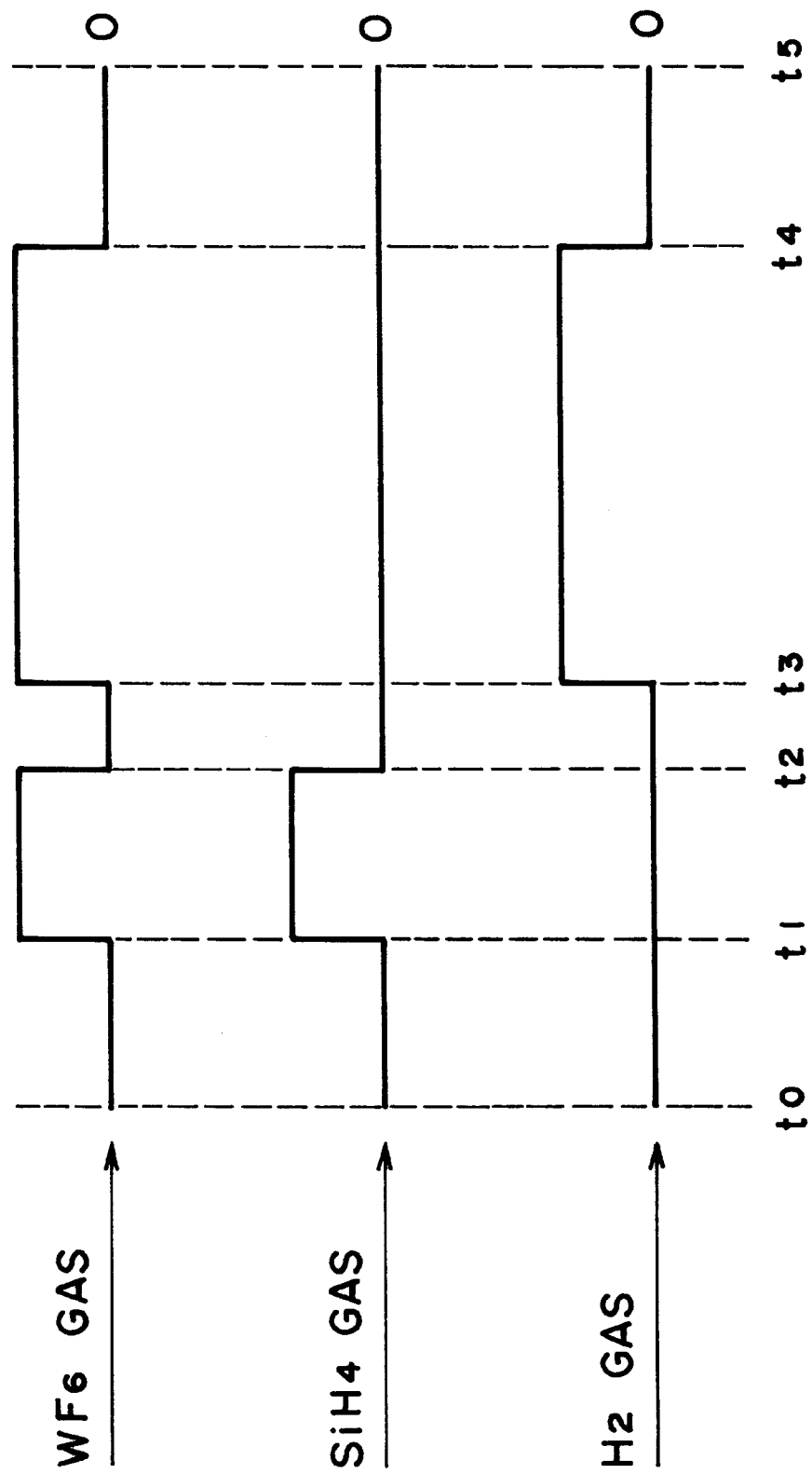
FIG. 5 is a timing chart of introduction of gases in the method shown in FIGS. 4A to 4D.

Next, a first low pressure CVD (LPCVD) process is effected using WF$_6$/SiH$_4$ gases at a flow rate ratio of 1 to 2 therebetween, with the temperature between 400° C. and 500° C., ambient pressure between several Torr and several tens of Torr, to obtain an about 50-nm-thick first tungsten film 20 on the entire surface. Referring to FIG. 5 showing introduction of gases in the first LPCVD process, SiH$_4$ gas and WF$_6$ gas are simultaneously introduced into the CVD chamber at (time instant) t1 and simultaneously stopped for introduction at t2. Then, a second LPCVD process is effected using WF$_6$/H$_2$ gases, with the flow rate ratio therebetween selected at 0.1 to 0.2, temperature between 400° C. and 500° C., pressure between 80 Torr and 120 Torr, to thereby deposit a second tungsten film 21 having a thickness between 0.5 $\mu$m and 1.0 $\mu$m and filling the second via-hole 16B. By this step, the structure shown in FIG. 4C is obtained.

As shown in FIG. 5, the deposition of the second tungsten film is effected during the time interval between t3 and t4 while introducing WF$_6$ gas and H$_2$ gas simultaneously. In this case, however, the starting and stopping of introduction of WF$_6$ gas and H$_2$ gas need not be effected simultaneously.

Figure 4D:
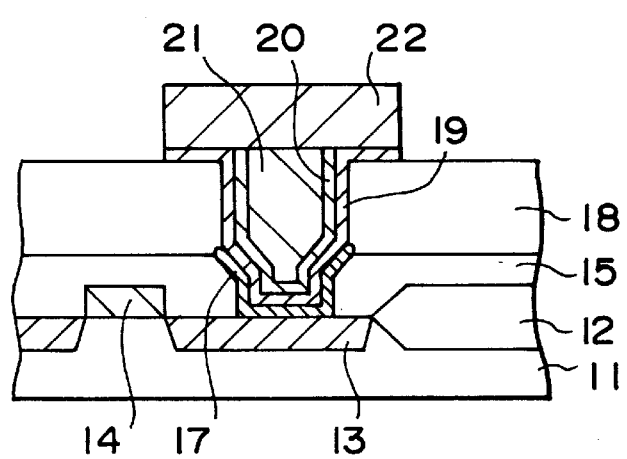

Next, the second tungsten film 21 and the first tungsten film 20 are etched until the Ti—TiN film 19 is exposed as shown in FIG. 4D. Thereafter, an Al film is deposited by a sputtering or metallization technique, followed by patterning thereof by a photolithographic and etching technique to form an Al interconnects.

In the first embodiment, the excess amount of SiH$_4$ is prevented by introduction of WF$_6$ gas simultaneously with the introduction of SiH$_4$ gas, the excess amount of SiH$_4$ gas in the mixture of WF$_6$ and SiH$_4$ gases causing vapor deposition of silicon or tungsten crystals forming undesirable particles. By our experiments, the first embodiment achieved a 15% reduction of particles during deposition of the tungsten films compared to the conventional process. This configuration also achieved a 5% improvement of the throughput in the deposition of the tungsten films by removing the time interval for introduction of SiH$_4$ alone.

FIG. 6 shows another timing chart for showing a second embodiment of the present invention, wherein introduction of WF$_6$ gas is effected at t1 before introduction of SiH$_4$ gas at t11 during the deposition step for the first tungsten film, and the introduction of WF$_6$ gas is stopped simultaneously with the stopping of the $SiH_4$ gas. The other configuration of the second embodiment is similar to the first embodiment, and accordingly, detailed description for the second embodiment is omitted here for avoiding a duplication.

The second embodiment also achieved a 5% improvement in the throughput as well as a 20% reduction of particles compared to the conventional process. The second embodiment has an additional advantage in that the delayed introduction of $SiH_4$ assures for prevention of excess amount of $SiH_4$ gas even if time delay occurs for the flow rate of $WF_6$ gas reaching at the desired rate.

Figure 7A:
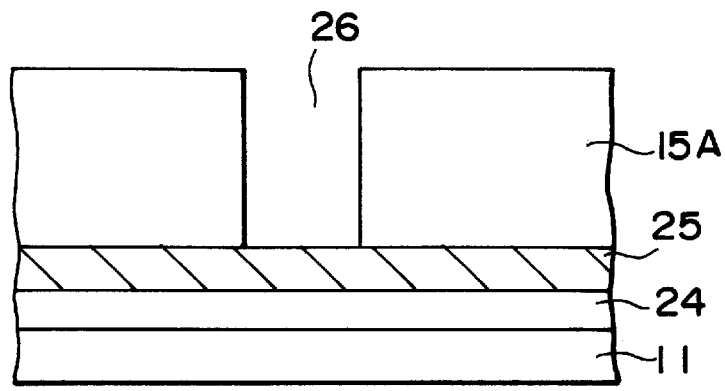
FIGS. 7A to 7C are cross-sectional view of a semiconductor device, showing consecutive steps of a process according to a third embodiment of the present invention.
Figure 7B:
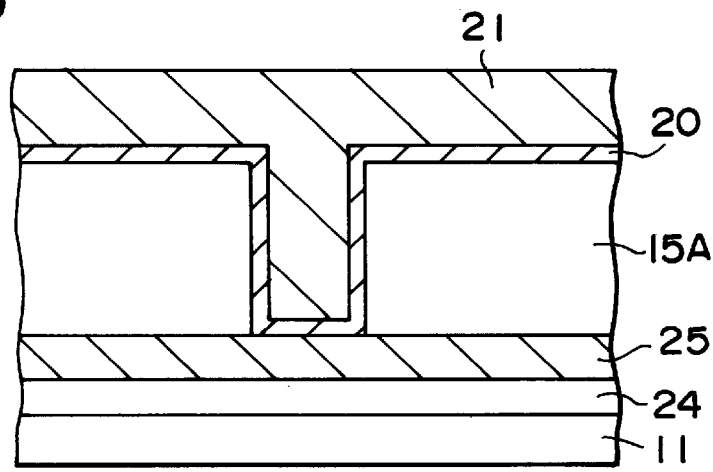
Figure 7C:
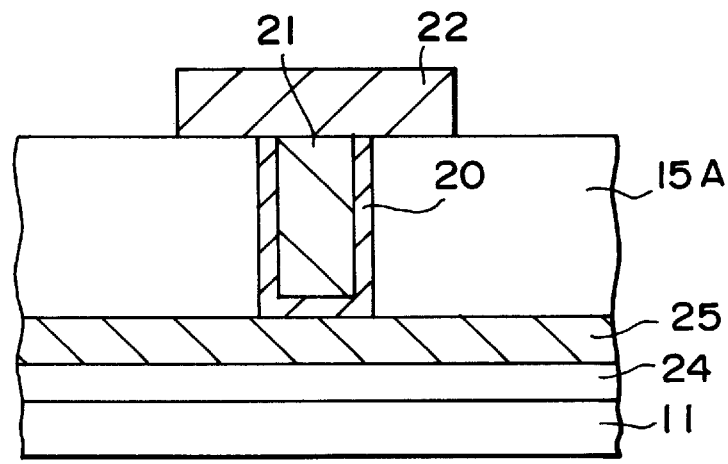

FIGS. 7A to 7C consecutively show a process steps of a method according to a third embodiment of the present invention.

A first interconnect layer 25 made of Al is deposited on an insulator film 24 made of BPSG formed on a silicon substrate 11. Then, an about 1-$\mu$m-thick interlayer dielectric film 15A made of BPSG is formed on the entire surface, followed by patterning the same to form a via-hole 26 exposing therethrough a portion of the first interconnect layer 25, as shown in FIG. 7A.

Subsequently, a first LPCVD process is effected using $WF_6$/$SiH_4$ gases to deposit a thin, first tungsten film 20, followed by a second LPCVD process using $WF_6$/$H_2$ gases to form a thick, second tungsten film 21 having a thickness between 0.5 $\mu$m and 1 $\mu$m. The timing for introduction of $WF_6$ gas and $H_2$ gas is similar to that shown in FIG. 5 or 6, and same applies to the other conditions of the CVD process.

Next, an etch-back technique is effected to the first and second tungsten films 20 and 21 to leave a tungsten plug made of the first and second tungsten films 20 and 21 within the via-hole 26. An Al film is then sputter-deposited on the entire surface, followed by patterning the same to form a second layer Al interconnects 22.

The configuration of the third embodiment can achieve a 15% or 20% reduction in particles compared to the conventional process.

Figure 1A:
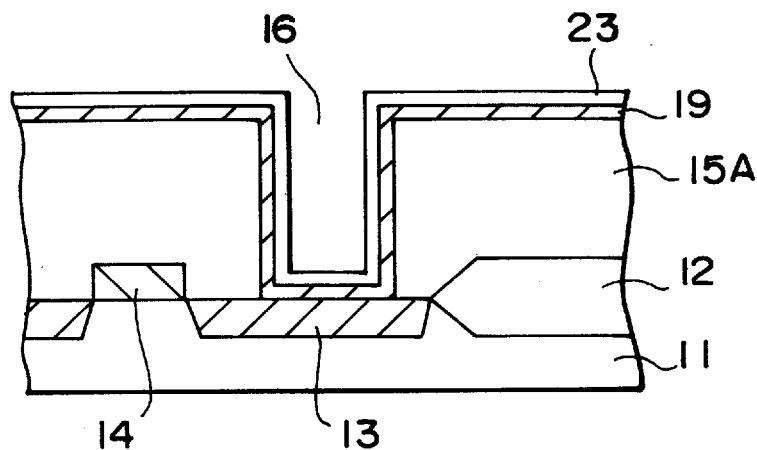
FIGS. 1A and 1B are sectional views of a conventional semiconductor device, consecutively showing a manufacturing process therefor.
Figure 1B:
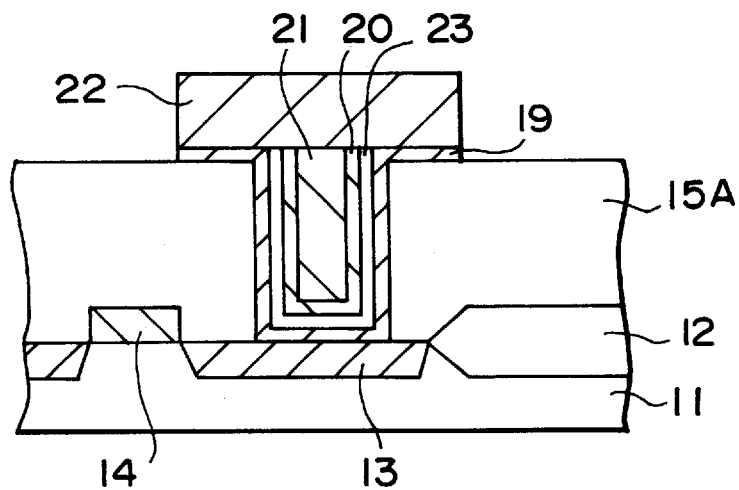
Figure 2:
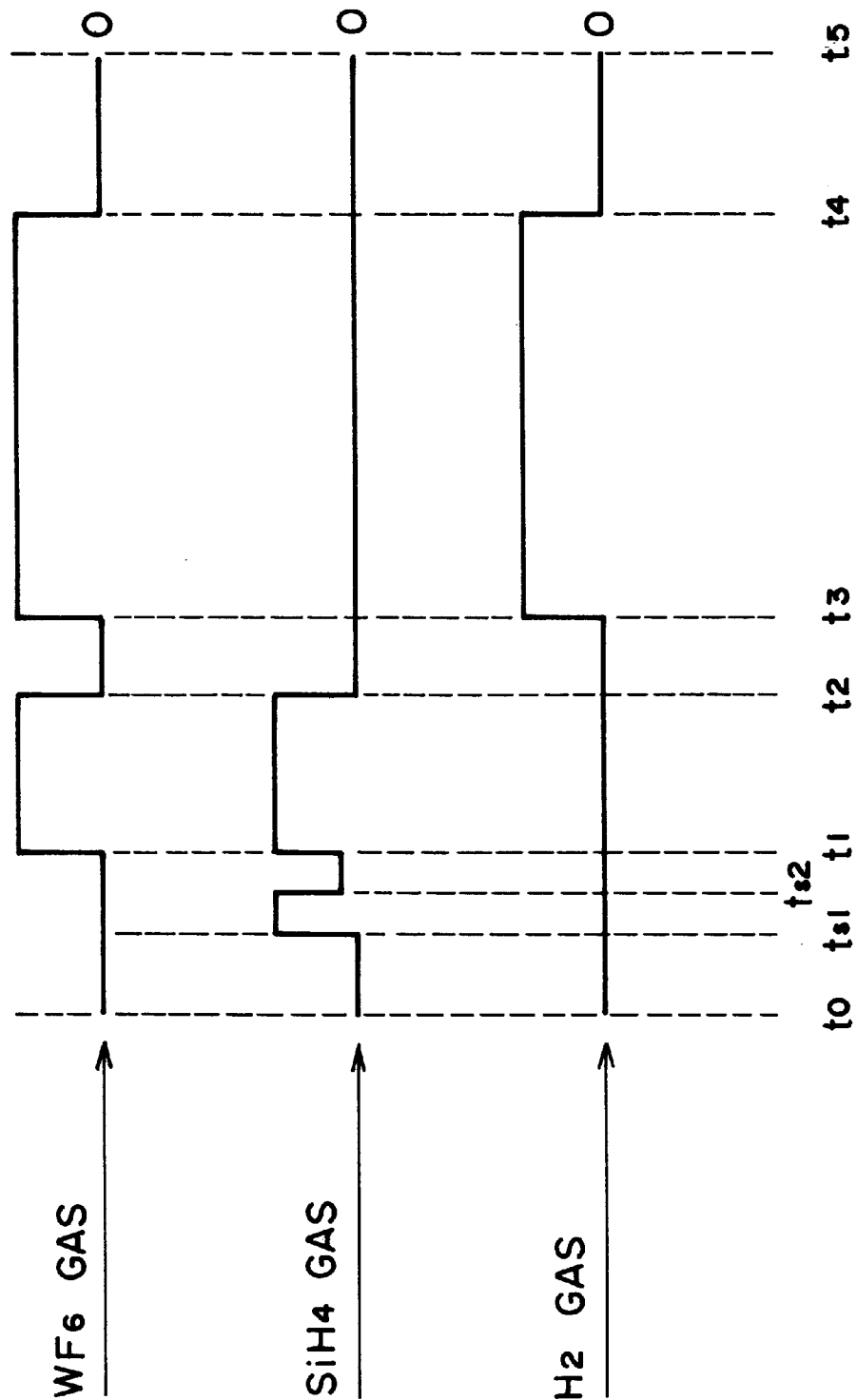
FIG. 2 is a timing chart for introduction of gases in the manufacturing process shown in FIGS. 1A and 1B.
Figure 3:
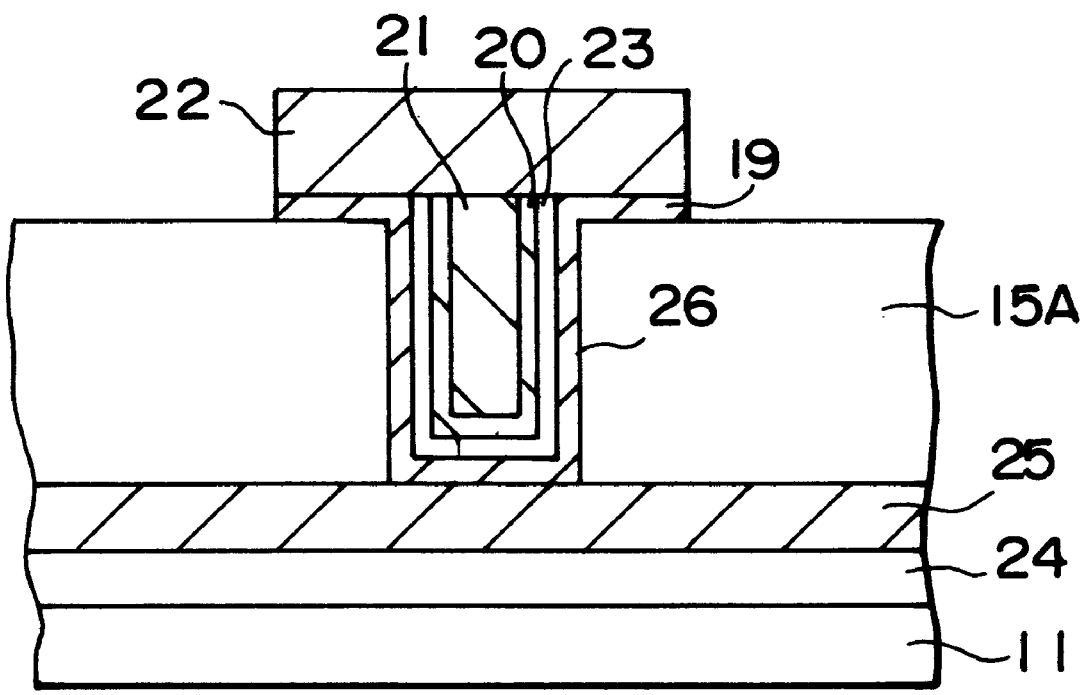
FIG. 3 is a sectional view of another conventional semiconductor device.

Back to FIG. 2 showing the timing chart in the conventional process, the introduction of $SiH_4$ during the time interval between ts1 and ts2 for Si film formation for reducing the leakage current enlarges the length of time for the heat treatment applied to the semiconductor device by the length of the time interval itself. The deposition temperature for the tungsten is as high as around 400° C. to 500° C. to cause the first layer interconnects underlying the Ti—Ni film to melt and protrude toward the Ti—Ni film in the shape of pin, thereby degrading the reliability in the interconnects. The present invention solves the problem in the conventional technique.

Although the present invention is described bay way of preferred embodiments thereof, the present invention is not limited to the described embodiments and various alterations or modifications can be easily made by those skilled in the art without departing from the scope of the present invention.

What is claimed is:

1. A method for forming an interconnection structure in a semiconductor device including the steps of:
    forming a diffused region in a semiconductor substrate;
    forming on said semiconductor substrate a first dielectric film having a first via-hole exposing said diffused region;
    forming a barrier layer on an inner surface of said first via-hole including said exposed diffused region;
    forming on said first dielectric film a second dielectric film having a second via-hole at the location of said first via-hole for exposing said barrier layer;
    depositing a conductor layer on an exposed surfaces of said second dielectric film and said exposed barrier layer in said second via-hole;
    forming a first tungsten film on said conductor layer by a first low-pressure CVD process using $SiH_4$ and $WF_6$ gases while maintaining a flow rate ratio between $WF_6$ gas and $SiH_4$ gas within a range of 1 to 2, the thickness of both said conductor layer and first tungsten film being smaller than the thickness of said second dielectric film;
    forming a second tungsten film on said first tungsten film by a second low-pressure CVD process using $H_2$ and $WF_6$ gases, said second tungsten film filling said second via-hole;
    patterning said first and second tungsten films to leave a tungsten plug in said second via-hole; and
    forming an interconnect layer overlying said second dielectric film and in contact with said tungsten plug.

2. A method for forming a tungsten plug in a semiconductor device as defined in claim 1 wherein $SiH_4$ gas is not used before the step of forming the first tungsten film.

3. A method for forming an interconnection structure in a semiconductor device, as defined by claim 1, wherein $SiH_4$ gas is only introduced during a first time period and $WF_6$ gas is simultaneously introduced with said $SiH_4$ gas during said first time period; and
    wherein $WF_6$ gas is introduced during a second time period.

4. A method for forming an interconnection structure in a semiconductor device including the steps of:
    forming a first interconnect layer overlying a semiconductor substrate;
    forming a dielectric film having a via-hole exposing a portion of said first interconnect layer;
    forming a first tungsten film on said dielectric layer by a first CVD process using $SiH_4$ and $WF_6$ gases while maintaining a flow rate ratio between $WF_6$ and $SiH_4$ gas gas within a range of 1 to 2, thickness of said first tungsten film being smaller than the thickness of said dielectric film;
    forming a second tungsten film on said first tungsten film by a second CVD process using $H_2$ and $WF_6$ gases, said second tungsten film filling said via-hole;
    patterning said first and second tungsten films to leave a tungsten plug in said via-hole; and
    forming a second interconnect layer overlying said dielectric film and in contact with said tungsten plug.

5. A method for forming an interconnection structure in a semiconductor device as defined in claim 4 wherein $SiH_4$ gas is not used before the step of forming the first tungsten film.

6. A method for forming an interconnection structure in a semiconductor device as defined in claim 4 wherein $SiH_4$ gas is only introduced during a first time period and $WF_6$ gas is simultaneously introduced with said $SiH_4$ gas during said first time period; and
    wherein $WF_6$ gas is introduced during a second time period.

7. A method as in claim 1, wherein formation of said second tungsten film occurs while maintaining a flow rate ratio of $WF_6$ gas and $H_2$ gas within a range of 0.1 to 0.2.

8. A method as in claim 4, wherein formation of said second tungsten film occurs while maintaining a flow rate ratio of $WF_6$ gas and $H_2$ gas within a range of 0.1 to 0.2.

* * * * *